United States Patent [19]

Provenzano et al.

[11] Patent Number: 5,448,444
[45] Date of Patent: Sep. 5, 1995

[54] CAPACITIVE PRESSURE SENSOR HAVING A REDUCED AREA DIELETRIC SPACER

[75] Inventors: Paul L. Provenzano, West Hartford; James L. Swindal, East Hampton; Robert J. Kuhlberg, Windsor; Charles B. Brahm, Ellington; Harold D. Meyer; Frank W. Gobetz, both of South Windsor; Walter J. Wiegand, Glastonbury; Robert H. Bullis, Avon, all of Conn.

[73] Assignee: United Technologies Corporation, Hartford, Conn.

[21] Appl. No.: 188,257

[22] Filed: Jan. 28, 1994

[51] Int. Cl.6 ............................................. H01G 7/00
[52] U.S. Cl. ................................... 361/283.4; 73/718
[58] Field of Search ............... 361/283.1, 283.3, 283.4; 73/715, 718, 724; 257/419; 338/4, 42; 128/675, 748; 29/25.41, 25.42, 621.1

[56] References Cited

U.S. PATENT DOCUMENTS

| | | | |
|---|---|---|---|
| 4,287,553 | 9/1981 | Braunlich | 73/724 |
| 4,405,970 | 9/1983 | Swindal et al. | 361/283.1 |
| 4,415,948 | 11/1983 | Grantham et al. | 29/25.41 |
| 4,467,394 | 8/1984 | Grantham et al. | 361/283.4 |
| 4,513,348 | 4/1985 | Grantham | 361/283.1 |
| 4,517,622 | 5/1985 | Male | 73/718 |
| 4,530,029 | 7/1985 | Beristain | 361/283.4 |
| 4,743,836 | 5/1988 | Grzybowski et al. | 324/678 |
| 4,879,627 | 11/1989 | Grantham | 361/283.3 |
| 4,883,768 | 11/1989 | Swindal et al. | 437/61 |
| 4,951,174 | 8/1990 | Grantham et al. | 361/283.4 |
| 4,954,925 | 9/1990 | Bullis et al. | 361/283.1 |
| 5,044,202 | 9/1991 | Southworth et al. | 73/724 |

FOREIGN PATENT DOCUMENTS

| | | | |
|---|---|---|---|
| 3137219 | 4/1983 | Germany | 73/724 |
| 0239940 | 10/1991 | Japan | 73/718 |

*Primary Examiner*—Bruce A. Reynolds
*Assistant Examiner*—Michael D. Switzer
*Attorney, Agent, or Firm*—Richard H. Kosakowski; Holland & Associates

[57] ABSTRACT

A silicon capacitive pressure sensor is disclosed that has a glass dielectric material sputter-deposited onto a silicon substrate of the sensor. After deposition of the bulk dielectric material, the glass is patterned and etched to form a pair of concentric rings. An inner ring is of a circular shape, while the outer ring is of an octagonal shape. As compared to prior art dielectric spacers which are of a single ring of relatively wide thickness, the pair of concentric rings disclosed herein significantly reduce the parasitic capacitance of the glass dielectric material, thereby increasing the sensitivity of the sensor.

20 Claims, 3 Drawing Sheets

CAPACITIVE PRESSURE SENSOR HAVING A REDUCED AREA DIELETRIC SPACER

BACKGROUND OF THE INVENTION

This invention relates to silicon capacitive pressure sensors, and more particularly to a silicon capacitive pressure sensor having a pair of silicon plates separated by a dielectric glass spacer, the spacer being in the form of a pair of separate, concentric rings.

In the art of silicon capacitive pressure sensors, it is known to provide such a sensor as a single sensing element. Prior art single element silicon capacitive pressure sensors typically comprise a pair of parallel conductive silicon plates. A borosilicate glass spacer is deposited onto one of the plates, and the second plate is attached to the glass spacer by a field-assisted, vacuum bonding process. This forms an evacuated chamber within the opposing conductive plates and spacer. The opposing silicon plates comprise the plates of a pressure variable capacitor. See, for example, U.S. Pat. Nos. 4,415,948, 4,405,970 and 4,530,029. Examples of electronic circuitry used to process the sensor output signals indicative of sensed pressure are described and claimed in U.S. Pat. Nos. 4,743,836 and 4,517,622.

In a silicon capacitive pressure sensor, one conductive silicon plate forms a diaphragm that flexes inwardly in the presence of fluid pressure applied to the outside surface of the diaphragm that is greater in magnitude than the pressure (usually vacuum) in the chamber. The second conductive silicon plate forms a substrate that is normally held rigid. The deflection of the diaphragm causes a variation in the distance between the plates, thereby varying the capacitance of the plates. Thus, the capacitive pressure sensor is operative to transduce pressure variations into corresponding capacitive variations. The borosilicate glass spacer serves not only to separate the plates, but also to seal the vacuum chamber therebetween. The silicon diaphragm and substrate are normally doped to make them appropriately electrically conductive.

These pressure sensing devices are particularly well suited for miniaturization due to the fine dimensional control achievable using the semiconductor and thin-film technologies. Microcircuit technology can produce a large number of pressure sensors fabricated from a single silicon wafer. They are also well suited to the measurement of small differential pressures in various commercial and aerospace applications.

However, in any silicon capacitive pressure sensor, parasitic capacitance is a limitation on the accuracy of the sensor. This is because such parasitic capacitance may result in an overall long-term drift (20 years) of the sensor output. This is especially true in high accuracy (0.05% or 500 ppm) pressure sensing applications at high temperatures (120° C.). This limiting factor may make some sensor designs unsuitable for demanding aerospace applications, such as electronic engine controls ("EECs") and air data computers ("ADCs").

Parasitic capacitance is the inherent capacitance of the non-pressure sensitive interstices of the sensor structure. For example, the parasitic capacitance of the borosilicate glass spacer may comprise upwards of 50% of the total capacitance of the sensor. Such parasitic capacitance reduces the sensor gain because it adds in parallel to the pressure sensitive capacitance of the sensor. This reduces both the dynamic range of the sensor and its sensitivity to pressure changes. Thus, a large effort has been placed in the past on reducing such capacitance through variations in the design of the sensor architecture.

However, parasitic capacitance is inherent in any physical structure and there is a minimum practically achievable value that may still be unacceptable in high sensitivity sensing applications. U.S. Pat. No. 4,405,970 discloses a method of reducing the parasitic capacitance in a silicon capacitive pressure sensor by providing specific borosilicate glass structures that separate fixed portions of the two capacitive plates at a relatively long distance from each other. Another approach to reducing the parasitic capacitance is disclosed in U.S. Pat. No. 4,467,394, in which a three-plate device is utilized that, when combined with appropriate signal processing circuitry, eliminates the parasitic capacitance from the measurement. A further approach to eliminating the parasitic capacitance is disclosed in U.S. Pat. No. 4,951,174.

It is known in the art of silicon capacitive pressure sensors to deposit and pattern the dielectric glass spacer into a single, "ring"-like structure having a certain lateral width or thickness. However, it has been found that such structure for the dielectric glass spacer has an undesirable parasitic capacitance that equals approximately fifty (50) percent of the total capacitance of the sensor. That is, this undesirable non-pressure sensitive parasitic capacitance approximately equals the desirable pressure sensitive capacitance of the sensor. Specific efforts at reducing the parasitic capacitance by varying the design of the dielectric glass spacer have met with varying success. See, for example, U.S. Pat. No. 4,954,925.

Accordingly, it is a primary object of the present invention to provide a silicon capacitive pressure sensor that has a significantly reduced amount of undesirable parasitic non-pressure sensor capacitance of the dielectric glass spacer portion of the sensor.

It is a general object of the present invention to provide a silicon capacitive pressure sensor having a pair of silicon capacitive plates separated by a dielectric glass spacer that is of reduced area construction.

It is another object of the present invention to provide a silicon capacitive pressure sensor having a reduced area glass dielectric spacer that is easily implementable in a manufacturing process for the sensor.

It is a still further object of the present invention to achieve long-term (20 years) performance stability of a silicon capacitive pressure sensor by reducing the drift of the sensor through reduction of one of the factors contributing to the drift of the sensor.

The above and other objects and advantages of this invention will become more readily apparent when the following description is read in conjunction with the accompanying drawings.

SUMMARY OF THE INVENTION

To overcome the deficiencies of the prior art and to achieve the objects listed above, the Applicants have invented an improved silicon capacitive pressure sensor having a dielectric spacer with reduced area. In the preferred embodiment of the present invention, the silicon capacitive pressure sensor has an octagon-shaped silicon substrate, which forms one plate of a parallel plate capacitor. The dielectric glass spacer is bulk deposited to a desired thickness onto a surface of the silicon substrate using a sputter deposition process.

The deposited glass is then patterned using standard photolithography and etching techniques to form a pair of concentric spacer "rings" separated from each other. The outer ring is octagon shaped to match the shape of the silicon substrate. The inner ring is circular. A square-shaped silicon diaphragm is then attached to the spacer rings by a field-assisted, vacuum bonding process. The present invention has utility in reducing the proportion of the parasitic capacitance to the overall capacitance of the sensor from approximately fifty (50) percent in prior art designs down to approximately fifteen (15) percent.

DETAILED DESCRIPTION OF THE PREFERRED EMBODIMENTS

Figure 1:
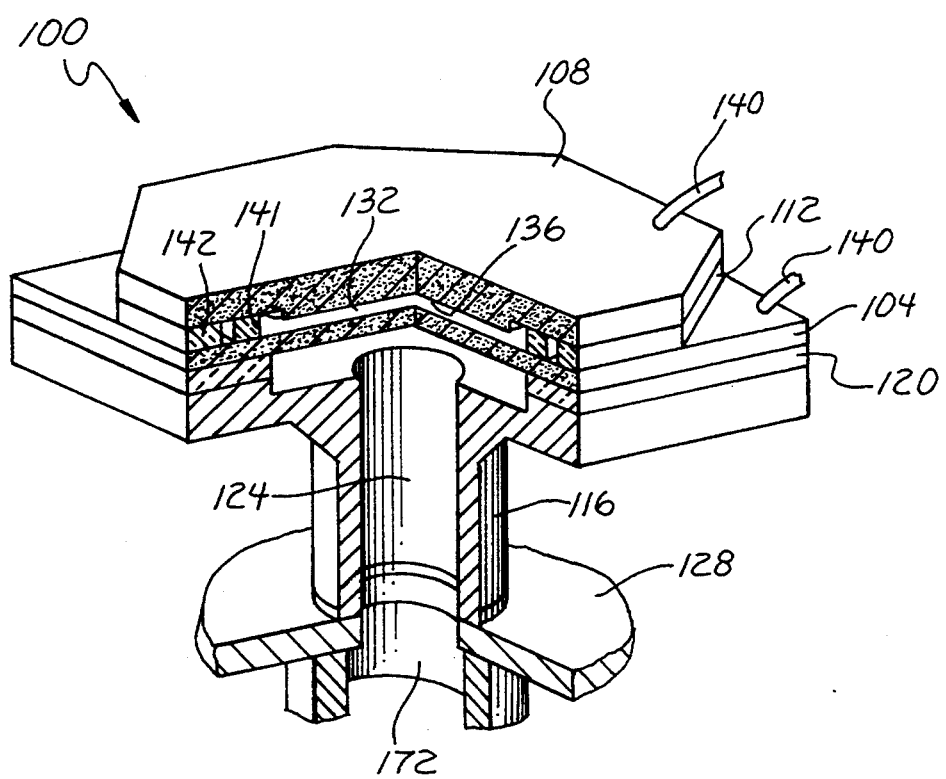
FIG. 1 is a perspective view, partially cutaway to reveal a cross-sectional view of a silicon capacitive pressure sensor having a glass dielectric spacer portion sputter-deposited onto a silicon substrate and then patterned to form the concentric rings of the present invention.

Referring to the drawings in detail, an exemplary embodiment of a silicon capacitive pressure sensor having a dielectric glass spacer structure in the form of a pair of concentric rings in accordance with the present invention is shown and generally designated by the reference numeral 100. The sensor 100 comprises a pair of parallel silicon capacitive plates (e.g., a diaphragm 104 and a substrate 108) separated by the borosilicate glass dielectric spacer 112 of the present invention. A silicon transition piece 116 is also provided that attaches to the silicon substrate 108 by a second dielectric spacer 120. The transition piece 116 has a throughbore 124 formed therein through which the fluid whose pressure is desired to be measured is applied to the diaphragm 104. The transition piece 116 may be mounted on a header 128, and the entire sensor 100 is encapsulated in a standard package (not shown), for example, a TO3 package. Electronic signal processing circuitry (not shown) may also be included within the package.

Referring now to FIG. 1, there illustrated is a perspective view, partially cut away to expose in cross-sectional form a silicon capacitive pressure sensor 100. The sensor 100 may be somewhat similar in structure to that described in the following U.S. patents, all assigned to the assignee of the present invention, and all hereby incorporated by reference: U.S. Pat. Nos. 4,879,627; 4,883,768; 4,951,174; 4,954,925; 4,513,348; 4,415,948 and 4,405,970. The sensor 100 comprises a silicon diaphragm 104 and a silicon substrate 108, arranged in parallel and separated by a dielectric spacer 112. The spacer 112 is typically made of borosilicate glass that may comprise, for example, the commercially available Model 7070 borosilicate glass supplied by Corning. However, the glass may comprise other commercially available brands of borosilicate glass, such as the Model 7740 borosilicate glass provided by Corning and sold under the trademark PYREX®. Alternatively, the glass may comprise, if desired, other types of glass, such as phosphosilicate. Thus, the sensor 100 comprises a silicon-glass-silicon ("SGS") sandwich that is typically square and/or octagonal in its exterior configuration, but often may be circular or cylindrical in shape for its inner, operative substructure.

The diaphragm 104 comprises a square sheet or plate of appropriately doped silicon, which is somewhat flexible. The substrate 108 also comprises an appropriately doped sheet of silicon. The substrate 108 is typically less flexible than the diaphragm 104. The dielectric spacer 112 disposed between the diaphragm 104 and substrate 108 creates a closed, evacuated, hermetically-sealed chamber 132 between the two parallel silicon plates 104, 108. The chamber 132 is typically held at a zero vacuum value, or, if desired, it can be sealed at a higher reference pressure. The pressure within the chamber 132 depends upon the desired pressure value that the sensor 100 is designed to measure small variations or differential values therearound. The chamber 132 thus provides a reference pressure on one side of the flexible diaphragm 104.

A centrally-located, typically circular mesa 136 is formed on a surface of the substrate 108. The mesa 136 extends into the generally cylindrical chamber 132. The mesa 136 serves as a counter-electrode to the flexible diaphragm 104. A thin insulating glass layer (not shown) may cover the top of the mesa 136. An upper surface of the mesa 136 is illustrated as being planar. However, the mesa 136 may be non-planar (e.g., concave), as described and claimed in U.S. Pat. No. 5,381,299.

In the exemplary embodiment of the silicon capacitive pressure sensor 100 of FIG. 1, the spacing between an undersurface of the silicon diaphragm 104 and the top of the mesa 136 is approximately 2.5 microns, while the thickness of the borosilicate glass spacer 112 is typically 9 microns. For an exemplary sensor 100 designed to sense variations in absolute pressure of fifty lbs. per square inch (50 psi), the silicon diaphragm 104 is approximately 8 thousandths (0.008") of an inch thick, while the substrate 108 is approximately fifty thousandths (0.050") of an inch thick.

As the pressure applied to an outside surface of the diaphragm 104 varies, the diaphragm 104 flexes toward the substrate 108. This causes the spacing between the diaphragm 104 and the substrate 108 to change. Since the diaphragm 104 and the substrate 108 serve as the plates of a parallel plate capacitor, the flexing of the diaphragm 104 inwardly increases the capacitance of the sensor 100. The change in capacitance as a result of the change in the pressure applied to the surface of the diaphragm 104 is used as a measure of the pressure applied to the sensor 100.

A pair of electrical conductors or wires 140 are connected to the diaphragm 104 and substrate 108 for connection to a well-known signal processing circuit (not shown), located external to the sensor 100. The circuit may be located within the package (not shown) for the sensor 100. The circuit typically responds to the changing capacitance of the sensor 100 as a function of the applied pressure on the diaphragm 104. The varying pressure on the exterior, sensing surface of the flexible silicon diaphragm 104 causes the diaphragm 104 to flex.

Such flexing changes the value of the intersticial capacitance between the diaphragm 104 and the substrate 108, which transduces the applied pressure into a measurable electronic signal. As noted hereinabove, there is an approximately 2.5 micron spacing between the undersurface of the diaphragm 104 and the top of the mesa 136 when the sensor 100 is at its zero or otherwise reference pressure. Such spacing allows room for the diaphragm 104 to flex toward the mesa 136 as the pressure applied on the exterior surface of the diaphragm 104 is increased.

Figure 2:
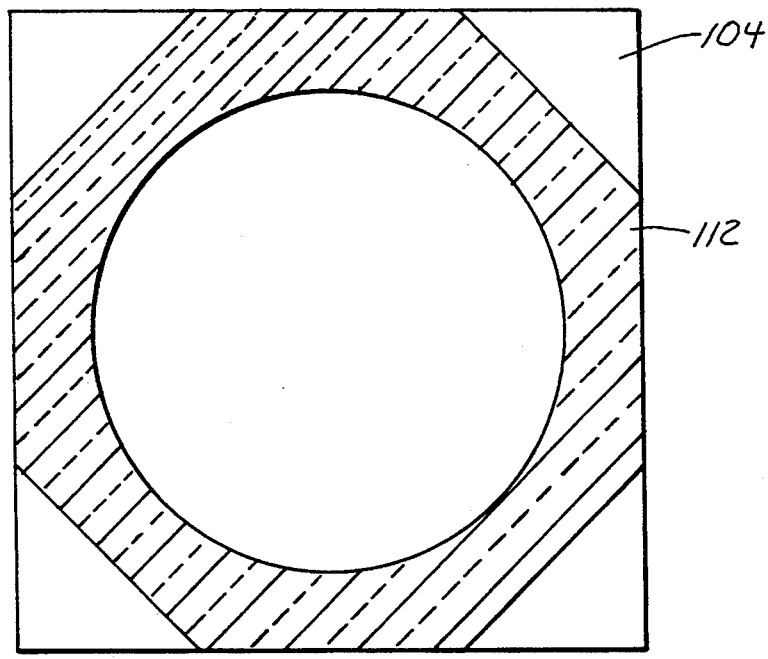
FIG. 2 is a top plan view of a square-shaped silicon diaphragm having an octagon-shaped glass dielectric spacer disposed thereon and patterned to form a single ring, as in the prior art.

Referring now to FIG. 2, there illustrated is a prior art structure for the glass dielectric spacer 112. The spacer 112 is formed as a single ring, the wall of which typically has a horizontal thickness of, e.g., thirty-six thousandths (0.036") of an inch. As illustrated in FIGS. 1 and 2, the silicon diaphragm 104 may typically be square, while the silicon substrate 108 may have octagonal shape. The octagonal shape of the substrate 108 provides access for attachment of the electrical wires 140 to the silicon diaphragm 104. In the prior art sensor of FIG. 2, the silicon substrate 108 has a side length of two hundred sixty thousandths (0.260") of an inch, while the wall of the borosilicate glass spacer 112 has an inner diameter of one hundred ninety thousandths (0.190") of an inch. The outer side surface of the wall spacer 112 can either follow the basic square configuration of the silicon diaphragm 104, or it may be octagonal, as illustrated in FIGS. 1 and 2, similar to the octagonal shape of the substrate 108. The mesa 136 extends up from the silicon substrate 108 to a dimension of approximately 6.5 microns. The diameter of the mesa 136 may be one hundred fifty thousandths (0.150") of an inch.

In FIG. 1, a transition piece 116, comprised of appropriately doped silicon, is fabricated with the second borosilicate glass spacer 120 that, in turn, is bonded to the exterior surface of the silicon diaphragm 104. The glass spacer 120 may also comprise the Model 7070 glass provided by Corning, or other suitable glass. The transition piece 116 includes a pressure port 124, which comprises a throughbore, through which the fluid whose pressure is to be sensed is communicated to the exterior surface of the diaphragm 104. The transition piece 116 tapers down to its pedestal shape for mounting to the surface of the header 128. The pedestal shape accommodates the temperature coefficient mismatch between the silicon and header material. Typically, the transition piece 116 has a thickness of approximately one hundred twenty-five thousandths (0.125") of an inch.

Figure 3:
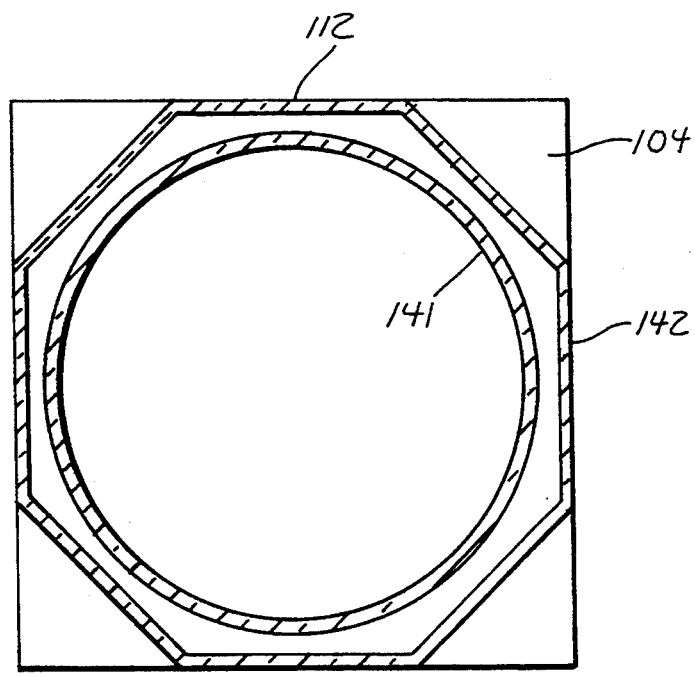
FIG. 3 is a top plan view of the square-shaped silicon diaphragm having an octagon-shaped dielectric glass spacer disposed thereon and patterned to form the pair of concentric rings, in accordance with the present invention.
Figure 4:
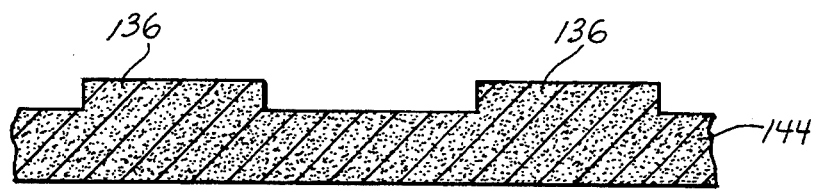
FIGS. 4–8 are cross sectional views illustrating various steps in the sequential fabrication of the silicon capacitive pressure sensor of FIG. 1.

Referring now to FIG. 3, there illustrated is a top plan view of the silicon diaphragm 104 with the glass dielectric spacer 112 attached to a surface of the diaphragm 104 and patterned to form the pair of concentric rings 141, 142 in accordance with the present invention. The specific methodologies for forming the concentric rings 141, 142 is described in greater detail hereinafter in FIGS. 4–8 with respect to the sequence of steps in fabricating the silicon capacitive pressure sensor 100. In the preferred embodiment of the present invention, the inner ring 141 is circular while the outer ring 142 is octagonal. The inside diameter of the circular inner ring 141 may be approximately one hundred ninety thousandths (0.190") of an inch, similar to that of the prior art sensor of FIG. 2. The thickness of each ring 141, 142 is uniform and is approximately one hundred fifty microns (slightly less than 6 mils; 0.006"). As can be seen from FIG. 3, the spacing between the rings 141, 142 varies due to the fact that the inner ring 141 is circular while the outer ring 142 is octagonal. The minimum amount of spacing between the rings 141, 142 is approximately six mils (0.006"). The aforementioned dimensions of the inner and outer rings 141, 142 results in a silicon substrate 108 with a somewhat smaller side length of approximately two hundred twenty-five thousandths (0.225") of an inch, compared to two hundred sixty thousandths (0.260") of an inch in the prior art design of FIG. 2. This reduced size not only reduces the parasitic capacitance, but it also increases the number of sensors that can be fabricated from a single silicon substrate wafer and a single silicon diaphragm wafer, with such processing being described in detail hereinafter with respect to FIGS. 4–8.

The inner ring 141 is circular for structural reasons in that the inner ring 141 approximates the circular nature of the inner, operative substructure of the sensor 100, such as the mesa 136. In the preferred embodiment of the present invention, the outer ring 142 is octagonal due to the fact that the silicon substrate 108 is also octagonal. The octagonal shape of both the substrate 108 and the outer ring 142 is formed by dicing or sawing the substrate 108 and the outer ring 142. This removes portions of both the substrate 108 and the outer ring 142 to expose portions of the surface of the silicon diaphragm 104 for connection of the electrical wires 140 thereto. The dicing or sawing results in contiguous planar outer surfaces of both the substrate 112 and the outer ring 142.

It is to be understood, however, that the present invention is not limited to having an octagonal-shape outer ring 142; other shapes may be used if desired. Further, other shapes may be used for the inner ring 141 as well, without departing from the broadest scope of the present invention. Further, the rings 141, 142 are described as being spaced apart from each other. However, it is to be understood that the two rings 141, 142 may be connected by some amount of glass dielectric spacer. In practice, it has been found that total separation between the two rings 141, 142 best facilitates the goal of reducing the parasitic capacitance of the sensor 100 as much as possible. It has been proven in practice that the pair of rings of the present invention reduces the proportion of the parasitic capacitance to the overall capacitance of the sensor 100 from approximately fifty (50) percent in the prior art design of FIG. 2 to approximately fifteen (15) percent in the concentric ring design of FIG. 3.

Referring now to FIGS. 4–8, there illustrated in cross-sectional form is the sequence of steps in fabricating the sensor 100 of FIG. 1. The starting point in the fabrication process is a commercially-available silicon wafer 144 (FIG. 4) that comprises the substrate 108 of a fabricated sensor 100. To make the wafer 144 suitably electrically conductive, the wafer 144 is appropriately doped with, for example, antimony. However, the substrate wafer 144 may either be doped with either N or P type impurities having a doping concentration of at least $10^{15}$ impurity per cubic centimeter to achieve less than 1 ohm-centimeter resistivity. Using well-known masking, photoresist and etching techniques, the substrate wafer 144 is etched away at predetermined locations to create a plurality of mesas 136, each mesa 136 being approximately 6.5 microns in height.

Figure 5:
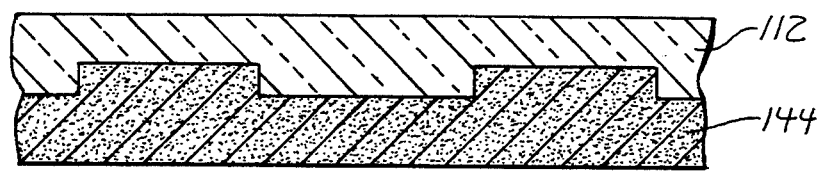
Figure 6:
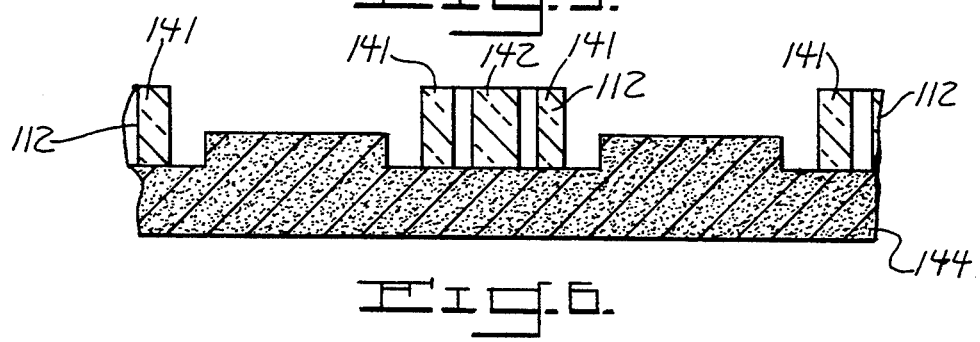

Next, referring to FIG. 5, the glass that serves as the dielectric 112 between the diaphragm 104 and the substrate 108 is deposited onto the silicon substrate wafer 144. The glass 112 may be deposited onto the wafer 144 using any one of a number of well-known deposition techniques, such as vacuum deposition or sputtering. One sputter-deposition technique that may be used to deposit the glass is an ion-milling technique, as described and claimed in U.S. Pat. No. 5,375,034. The glass 112 is deposited to a thickness of approximately 9 microns. The deposited glass 112 serves three purposes: as a dielectric spacer 112 forming an enclosed vacuum chamber 132 between the conductive substrate 108 and conductive diaphragm 104; as a means of forming a precise gap between the diaphragm 104 and substrate 108; and as an agent for bonding the silicon substrate 108 and diaphragm 104 to the spacer 112.

The type of glass used as the spacer 112 is important. In an exemplary embodiment of the present invention, the glass 112 comprises the Model 7070 borosilicate glass provided by Corning. This glass 112 has thermal properties (e.g., thermal expansion coefficients) similar to the silicon substrate 108. Also, this specific model of glass 112 has lithium and potassium ions that are available to assist in the bonding of the diaphragm 104 to the glass spacer 112, as described in greater detail hereinafter. However, the glass may comprise other commercially available brands of borosilicate glass, such as Model 7740 borosilicate glass provided by Corning and sold under the trademark PYREX ®. Alternatively, the glass may comprise, if desired, other types of glass, such as phosphosilicate. The type of glass utilized is based in part on the type(s) of alkali contained in the glass.

The next step in the process of fabricating the silicon capacitive pressure sensor 100 is that the silicon substrate wafer 144 with the glass spacer 112 formed thereon in bulk may be subject to thermal processing, such as annealing, to reduce any stresses in the glass. If desired, the silicon substrate wafer 144 may be subject to a thermal processing procedure described and claimed in copending U.S. Patent Application entitled "Thermal Processing of Deposited Glass", filed Dec. 21, 1993, Ser. No. 08/188,952, and assigned to the same assignee as the present invention. Such thermal processing of the glass ensures that any gas particles which are formed inherent in the glass as a result of a sputter-deposition process will diffuse out of the glass, and thus will not contribute to any long-term drift of the sensor. Also, the thermal process ensures that no undesirable and ruinous internal cavities (i.e., "bubbles") will be formed in the glass as a result of other prior art thermal processing procedures.

After the substrate wafer 144 with the glass 112 has been subjected to a thermal processing procedure, the borosilicate glass layer 112 is appropriately etched or patterned (FIG. 6) using well-known photolithography and etching techniques. This forms the pair of concentric glass rings 141, 142 in accordance with the present invention. These patterning techniques also form the glass spacer 112 only around the approximate perimeter of that portion of the silicon substrate wafer 144 that comprises the substrate 108 of the fabricated sensor 100.

Figure 7:
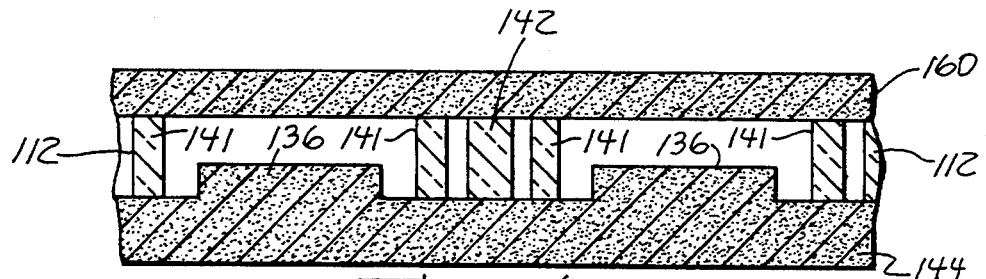

After the substrate wafer 144 has been prepared as described hereinbefore, a second silicon wafer 160 may be prepared, by suitable lapping to a desired thickness, such as on the order of 200 microns (i.e., approximately eight mils (0.008")), to form the flexible diaphragm 104 (see FIG. 7). In a similar manner to the silicon substrate wafer 144, the silicon diaphragm wafer 160 may be appropriately doped with the desired impurities. The silicon diaphragm wafer 160 is then bonded to the dielectric glass spacer 112 using known electrostatic bonding techniques. For example, the diaphragm wafer 160 may be bonded using the known field-assisted sealing technique of joining glass to semiconductors. This technique involves subjecting the diaphragm wafer 160 to temperatures of approximately 300°–500° C. to induce ionic mobility within the borosilicate glass. The aforementioned Model 7070 glass from Corning has lithium and potassium ions available at high temperature that may be used in this electrostatic bonding technique. After being heated to a high degree of conductivity, the glass spacer and diaphragm junction is then subjected to an electric potential on the order of 100 volts DC. This produces a depletion layer at the interface between the silicon and the glass. If the electric potential is properly directed, the positive lithium and potassium ions drift away from the interface and a high field is created across this interface. This causes intimate contact between the glass spacer 112 and the silicon diaphragm wafer 160. In this manner, a hermetic seal between the silicon and glass is formed. This above-described process is normally accomplished in a vacuum in order to provide an absolute pressure sensor.

Both the silicon substrate wafer 144 and silicon diaphragm wafer 160 may have a thin metallization layer deposited locally thereon, for example, a layer of about five thousand angstroms of aluminum. This provides a suitable surface for wire bonding of the electrical wires 140 to both the diaphragm 104 and the substrate 108.

Next, another wafer 164 of appropriately doped silicon is provided. This silicon wafer comprises the transition piece 116 of a fabricated sensor 100. More particularly, the wafer 164 has the desired transition pieces 116 formed at appropriate locations in the wafer by forming the pedestal-shaped outer surface and the throughbores 124 therein. The pedestal shapes and throughbores 124 may be etched in the transition piece silicon wafer 164 using various techniques. For example, the shapes and throughbores 124 may be formed in the transition piece using the electrical discharge machining ("EDM") techniques described and claimed in copending U.S. patent application entitled "Fabricating Complex Silicon Pieces Using Electrical Discharge Machining", filed Dec. 2, 1993, Ser. No. 08/161,156, and assigned to the same assignee as the present invention. The transition piece wafer 164 may be on the order of one hundred twenty-five thousandths (0.125") of an inch thick.

Figure 8:
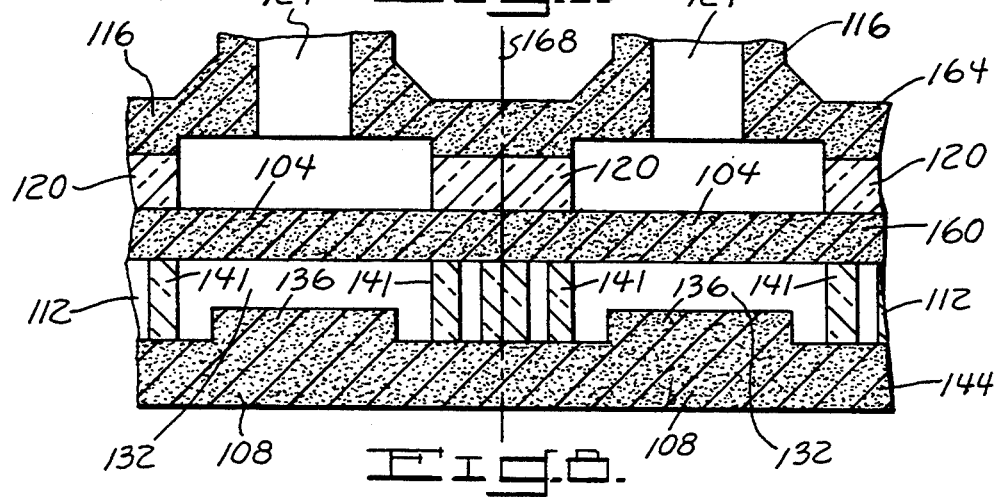

The transition piece wafer 164 then has a layer 120 of dielectric glass deposited thereon. The glass deposited onto the silicon wafer 164 may also comprise the Model 7070 borosilicate glass from Corning. The glass layer 120 may be deposited in an identical manner as the glass spacer 112 deposited onto the silicon substrate 108. The second glass layer 120 is photolithographically patterned and etched into a ring only around the perimeter of the resulting transition piece 116. The glass layer 120 is then bonded to the silicon diaphragm wafer 160 using electrostatic bonding techniques. The glass layer 120 contacts the diaphragm wafer 160, as illustrated in FIG. 8.

Once the aforementioned steps illustrated in FIGS. 4–8 have taken place, the resulting silicon and glass multi-layered component is diced appropriately, such as by sawing, to provide a plurality of individual piece parts, as indicated by the phantom lines 168. Also, both the silicon substrate 108 and the glass spacer 112 may, if desired, be cut into an octagon shape to expose the electrical connection points on the silicon diaphragm 104.

The individual piece part silicon capacitive pressure sensor 100 may then be mounted to a surface of the header 128 (FIG. 1). The header may comprise a material sold under the trademark KOVAR®, or other similar alloys. The header has a throughbore 172 that acts as a pressure port through which the fluid whose pressure is desired to be measured by the sensor 100 is applied thereto. The throughbore 124 of the transition piece 116 is aligned over the pressure port 172 such that the transition piece 116 is in contact with the surface of the header 128. The transition piece 116 is then bonded to the header 128 using an eutectic bonding process. This process involves coating with gold the outer surface of the silicon transition piece 116 that is to contact the header 128. Then, the sensor 100 and the header 128 are heated at an elevated temperature to bond the sensor 100 to the header 128.

It should be understood by those skilled in the art that structural modifications can be made without departing from the spirit of the invention. Accordingly, reference should be made primarily to the accompanying claims, rather than the foregoing specification, to determine the scope of the invention.

Having thus described the invention, what is claimed is:

1. A silicon capacitive pressure sensor, comprising:
   a. a silicon substrate;
   b. a silicon diaphragm operable to flex in the presence of a pressure of a fluid applied thereto, the silicon diaphragm and the silicon substrate comprising plates of a pressure-sensitive capacitor whose total capacitance value changes as the silicon diaphragm flexes relative to the substrate, a portion of the silicon diaphragm that flexes and a portion of the silicon substrate opposite the portion of the silicon diaphragm that flexes comprising a variable capacitance value portion of the total capacitance value of the pressure-sensitive capacitor; and
   c. a dielectric spacer disposed between and attached to both the silicon substrate and the silicon diaphragm around the outer peripheral portions thereof to form an enclosed chamber bounded by the silicon substrate, the silicon diaphragm and the dielectric spacer, the dielectric spacer having an inner ring of a predetermined shape and thickness, the dielectric spacer also having an outer ring of a predetermined shape and thickness, the outer ring being physically separated from the inner ring by a predetermined distance, a portion of the silicon diaphragm attached to the dielectric spacer and a portion of the silicon substrate attached to the dielectric spacer comprising a fixed parasitic capacitance value portion of the total capacitance value of the pressure-sensitive capacitor, the parasitic capacitance being a non-pressure-sensitive portion of the pressure-sensitive capacitor and being less than fifty percent of the total capacitance value of the pressure-sensitive capacitor.

2. The silicon capacitive pressure sensor of claim 1, wherein the dielectric spacer comprises glass.

3. The silicon capacitive pressure sensor of claim 1, wherein the dielectric spacer comprises borosilicate glass.

4. The silicon capacitive pressure sensor of claim 1, wherein the predetermined shape of the inner ring of the spacer is circular.

5. The silicon capacitive pressure sensor of claim 1, wherein the predetermined shape of the outer ring is octagonal.

6. The silicon capacitive pressure sensor of claim 1, wherein the silicon substrate has an octagonal shape for its outer perimeter, and wherein the predetermined shape of the outer ring is octagonal, a surface of an outer edge of the silicon substrate on each of the eight sides of the substrate being coplanar with a surface of an outer edge of the outer ring on each of the eight sides of the outer ring.

7. In a silicon capacitive pressure sensor having a planar silicon substrate and a planar silicon diaphragm separated by a dielectric spacer attached to and disposed around outer peripheral portions of the silicon substrate and the silicon diaphragm such that an enclosed cavity is formed bonded by the substrate, the diaphragm and the spacer, the diaphragm being operable to flex in the presence of a fluid applied to the diaphragm having a fluid pressure greater than a pressure of a fluid contained within the enclosed cavity, the silicon substrate and silicon diaphragm forming the plates of a parallel plate capacitor having a total capacitance value, the capacitor transducing any flexing of the silicon diaphragm due to the applied fluid pressure into a corresponding variable capacitance value indicative of an instantaneous value of the pressure of the fluid applied to the silicon diaphragm, a portion of the silicon diaphragm that flexes and a portion of the silicon substrate opposite the portion of the silicon diaphragm that flexes comprising a variable capacitance value portion of the total capacitance value, wherein the improvement comprises: the dielectric spacer includes two or more rings, each ring being of a predetermined shape and thickness, a portion of the silicon diaphragm attached to the dielectric spacer and a portion of the silicon substrate attached to the dielectric spacer comprising a fixed parasitic capacitance value portion of the total capacitance value, the parasitic capacitance being a non-pressure-sensitive portion of the capacitor and being less than fifty percent of the total capacitance value of the capacitor.

8. The silicon capacitive pressure sensor of claim 7, wherein the dielectric spacer comprises glass.

9. The silicon capacitive pressure sensor of claim 7, wherein the dielectric spacer comprises borosilicate glass.

10. The silicon capacitive pressure sensor of claim 7, wherein the predetermined shape of the inner ring of the spacer is circular.

11. The silicon capacitive pressure sensor of claim 7, wherein the predetermined shape of the outer ring is octagonal.

12. The silicon capacitive pressure sensor of claim 7, wherein the silicon substrate has an octagonal shape for its outer perimeter, and wherein the predetermined shape of the outer ring is octagonal, the surface of an outer edge of the silicon substrate on each of the eight sides of the substrate being coplanar with a surface of an outer edge of the outer ring on each of the eight sides of the outer ring.

13. A capacitive pressure sensor operable to sense a pressure of a fluid applied thereto and to transduce the fluid pressure into a corresponding capacitance value, the sensor comprising:
   a. an electrically-conductive substrate;
   b. a dielectric spacer deposited onto a surface of the substrate and patterned into a predetermined structure having an inner ring of a predetermined shape and thickness and having an outer ring of a predetermined shape and thickness; and c. an electrically-conductive diaphragm attached to the dielectric spacer, the diaphragm being operable to flex in the presence of a fluid pressure applied thereto, the diaphragm and the substrate comprising plates of a pressure-sensitive capacitor whose total capacitance value changes as the diaphragm flexes relative to the substrate, a portion of the diaphragm that flexes and a portion of the substrate opposite the portion of the diaphragm that flexes comprising a variable capacitance value portion of the total capacitance value of the pressure-sensitive capacitor, a portion of the diaphragm attached to the dielectric spacer and a portion of the substrate attached to the dielectric spacer comprising a fixed parasitic capacitance value portion of the total capacitance value of the pressure-sensitive capacitor, the parasitic capacitance being a non-pressure-sensitive portion of the pressure-sensitive capacitor and being less than fifty percent of the total capacitance value of the pressure-sensitive capacitor.

14. The capacitive pressure sensor of claim 13, wherein the dielectric spacer comprises borosilicate glass.

15. The capacitive pressure sensor of claim 13, wherein the dielectric spacer is sputter deposited onto the surface of the substrate.

16. The capacitive pressure sensor of claim 13, wherein the diaphragm is attached to the dielectric spacer using a field assisted bonding process.

17. The capacitive pressure sensor of claim 13, wherein the predetermined shape of the inner ring of the dielectric spacer is circular.

18. The capacitive pressure sensor of claim 13, wherein the predetermined shape of the outer ring is octagonal.

19. The capacitive pressure sensor of claim 13, wherein the inner and outer rings are physically separate from each other.

20. The capacitive pressure sensor of claim 13, wherein the substrate has an octagonal shape for its outer perimeter, and wherein the predetermined shape of the outer ring is octagonal.

* * * * *

UNITED STATES PATENT AND TRADEMARK OFFICE
CERTIFICATE OF CORRECTION

PATENT NO. : 5,448,444

DATED : September 5, 1995

INVENTOR(S) : Provenzano et al.

It is certified that error appears in the above-identified patent and that said Letters Patent is hereby corrected as shown below:

Column 7, line 39 of the Patent, change "Ser. No. 08/188,952" to --Ser. No. 08/171,011--.

Signed and Sealed this

Twelfth Day of December, 1995

Attest:

BRUCE LEHMAN

Attesting Officer    Commissioner of Patents and Trademarks